United States Patent
Ramaswamy Venkat et al.

(10) Patent No.: US 12,432,869 B1
(45) Date of Patent: Sep. 30, 2025

(54) APPARATUS TO PREVENT PHYSICAL ADJUSTMENT OF A KNOB OF A FIELD-REPLACEABLE UNIT (FRU)

(71) Applicant: Juniper Networks, Inc., Sunnyvale, CA (US)

(72) Inventors: Senthil Kumar Ramaswamy Venkat, Karnataka (IN); Raveen Jagadeesan, Bangalore (IN)

(73) Assignee: Juniper Networks, Inc., Sunnyvale, CA (US)

( * ) Notice: Subject to any disclaimer, the term of this patent is extended or adjusted under 35 U.S.C. 154(b) by 408 days.

(21) Appl. No.: 18/172,935

(22) Filed: Feb. 22, 2023

(51) Int. Cl.
*H05K 7/14* (2006.01)
*H05K 7/16* (2006.01)

(52) U.S. Cl.
CPC ......... *H05K 7/1401* (2013.01); *H05K 7/1417* (2013.01); *H05K 7/16* (2013.01)

(58) Field of Classification Search
None
See application file for complete search history.

(56) References Cited

U.S. PATENT DOCUMENTS

| | | | | |
|---|---|---|---|---|
| 3,739,608 | A * | 6/1973 | Young | E05B 13/001 70/428 |
| 4,570,470 | A * | 2/1986 | Gray, Sr. | E05B 13/001 70/424 |
| 4,838,059 | A * | 6/1989 | Johnson | E05B 17/142 70/427 |
| 5,560,235 | A * | 10/1996 | Aucoin | E05B 13/001 70/168 |
| 6,382,000 | B1 * | 5/2002 | Horton | B60R 25/066 70/202 |
| 6,658,906 | B1 * | 12/2003 | Wright | E05B 13/001 70/424 |
| 6,790,068 | B2 | 9/2004 | Westphall et al. | |
| 7,442,059 | B2 | 10/2008 | Oila | |
| 8,416,563 | B2 | 4/2013 | Hou | |
| 9,076,498 | B1 * | 7/2015 | Kuo | G11B 33/124 |

(Continued)

OTHER PUBLICATIONS

JuniperNetworks; "How to Insert and Remove MX304 Lmic"; posted to YouTube on Oct. 12, 2022; https://www.youtube.com/watch?v=CGpfp74NkfU.

(Continued)

*Primary Examiner* — Allen L Parker
*Assistant Examiner* — Christopher L Augustin
(74) *Attorney, Agent, or Firm* — Harrity & Harrity, LLP

(57) ABSTRACT

A field-replaceable unit (FRU) includes an ejector component that is to facilitate removal of the FRU from a network system chassis, a knob that is connected to the ejector component, and a knob adjustment prevention apparatus. The knob adjustment prevention apparatus includes a mounting component and a guard component. The mounting component is attached to a frame of the FRU. The guard component is connected to the mounting component and is to move between a closed position and one or more open positions. The guard component, when positioned in the closed position, surrounds the knob to prevent physical adjustment of the knob. This prevents activation of the ejector component, and thereby prevents removal of the FRU from the network system chassis, such as when the FRU is operating.

20 Claims, 11 Drawing Sheets

(56) References Cited

U.S. PATENT DOCUMENTS

| | | | |
|---|---|---|---|
| 9,877,407 B1* | 1/2018 | Sim | H05K 7/186 |
| 10,313,766 B1* | 6/2019 | Leung | H04Q 1/155 |
| 10,912,216 B1* | 2/2021 | Chia | H05K 7/20172 |
| 11,716,828 B1* | 8/2023 | Chen | H05K 7/1487 |
| | | | 361/679.02 |
| 2015/0146372 A1 | 5/2015 | French, Jr. et al. | |

OTHER PUBLICATIONS

Nicolas Fevrier; "How to Insert and Remove MX304 LMIC"; posted to YouTube on Sep. 30, 2022; https://www.youtube.com/watch?v=4luwz7C_H_o.

* cited by examiner

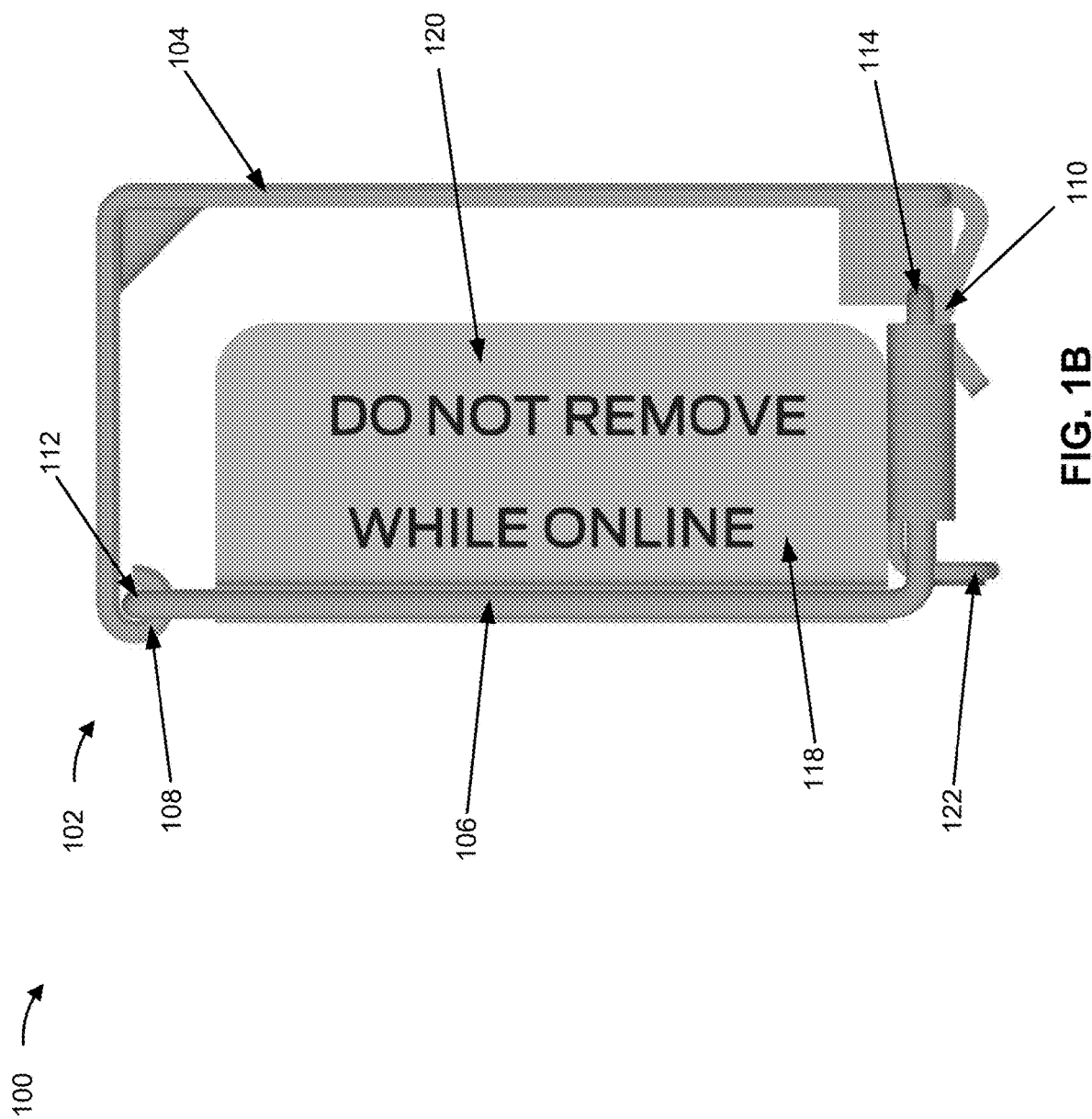

APPARATUS TO PREVENT PHYSICAL ADJUSTMENT OF A KNOB OF A FIELD-REPLACEABLE UNIT (FRU)

BACKGROUND

A field-replaceable unit (FRU) may be installed in a chassis of a network system (e.g., a network system router) to facilitate communication among computing devices within a network. An FRU is typically a modular device that is removable by a user (e.g., a network administrator) in the field. An FRU may include, for example, one or more power supplies, uplink modules, transceivers, fan trays, packet forwarding engines, routing engines, and/or switching modules.

SUMMARY

In some implementations, a knob adjustment prevention apparatus includes a mounting component that includes a hinge element and a latch element; and a guard component that includes a pivot element and an engagement element, wherein the mounting component is to attach to a frame of an FRU, the guard component is to, when positioned in a closed position, surround a knob of the FRU to prevent physical adjustment of the knob, the hinge element of the mounting component holds the pivot element of the guard component, and the engagement element of the guard component is to contact the latch element of the mounting component when the guard component is in the closed position.

In some implementations, an FRU includes an ejector component that is to facilitate removal of the FRU from a network system chassis; a knob that is connected to the ejector component; and a knob adjustment prevention apparatus that includes a mounting component and a guard component, wherein the mounting component is attached to a frame of the FRU, and the guard component, when positioned in a closed position, surrounds the knob.

In some implementations, an FRU includes a knob and a knob adjustment prevention apparatus that includes a mounting component and a guard component, wherein the mounting component is attached to a frame of the FRU, the guard component is connected to the mounting component and is to move between a closed position and one or more open positions, and the guard component, when positioned in the closed position, surrounds the knob.

BRIEF DESCRIPTION OF THE DRAWINGS

FIGS. 1A-1G are diagrams of an example associated with preventing physical adjustment of a knob of an FRU.

DETAILED DESCRIPTION

Figure 1A:
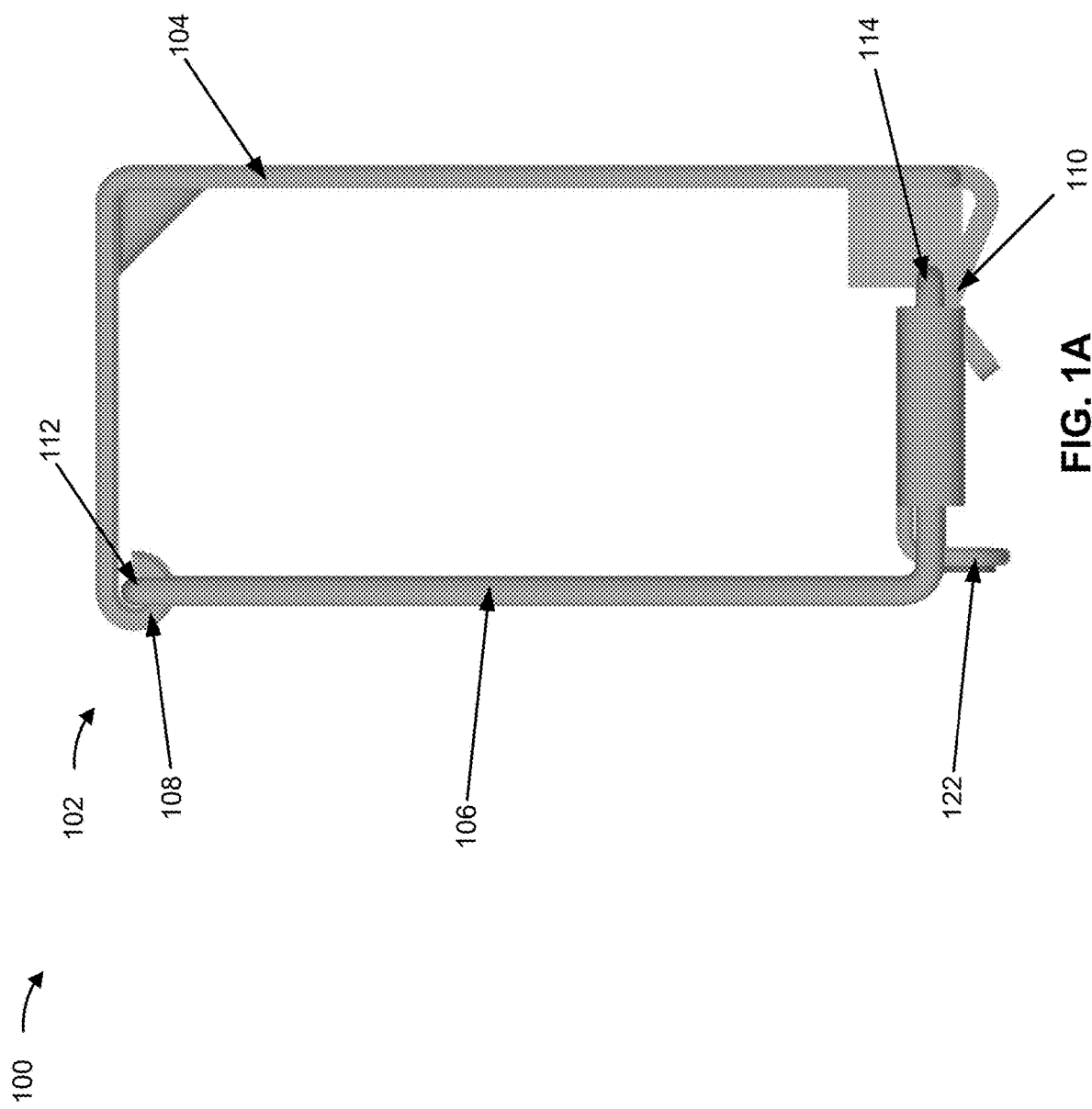

The following detailed description of example implementations refers to the accompanying drawings. The same reference numbers in different drawings may identify the same or similar elements.

From time to time, an FRU that is installed in a network system chassis (e.g., a chassis of a network system) may need to be removed (e.g., to allow for replacement of the FRU, maintenance of the FRU, or relocation of the FRU within the network system chassis, among other examples). In some cases, the network system chassis and/or the FRU may have "hot pluggable" features that allow the FRU to be removed while operating (e.g., when the FRU is turned on and in an active operation state). This allows the network system to continue operating and thereby continue to facilitate communication among computing devices within the network, even when the operating FRU is removed from the network system. In other cases, the network system chassis and/or the FRU may not have hot pluggable features, and consequently removing the FRU while the FRU is operating may cause the network system to enter a standby mode (e.g., until the FRU, or a replacement FRU, is installed in the network system chassis). Entering standby mode prevents the network system from facilitating communications among computing devices within a network, which results in communication failure, packet data loss, and/or traffic blackholing, among other examples.

Some implementations described herein provide an FRU that includes an ejector component (e.g., that is to facilitate removal of the FRU from a network system chassis), a knob that is connected to the ejector component, and a knob adjustment prevention apparatus. The knob adjustment prevention apparatus includes a mounting component (e.g., to connect the knob adjustment prevention apparatus to the FRU in association with the knob) and a guard component. The guard component is connected to the mounting component and is able to move (e.g., pivotally move) between a closed position and one or more open positions. The guard component, when positioned in the closed position, surrounds the knob to prevent physical adjustment of the knob. This prevents activation of the ejector component, and thereby prevents removal of the FRU from the network system chassis, such as when the FRU is operating.

Further, the guard component of the knob adjustment prevention apparatus is self-actuated to return to the closed position (e.g., due to gravity) from the one or more open positions. Accordingly, a physical force (e.g., that opposes gravity) must be applied to the guard component to cause the guard component to move to, or remain in, the one or more open positions, such as when a user (e.g., a network system administrator) pulls on the guard component in association with a knob adjustment operation. Further, the knob adjustment prevention apparatus includes an indicator element that includes display information that indicates when the FRU can be removed. For example, the display information may indicate that the FRU is not to be removed while the FRU is operating. In this way, the user is informed of when the user is able to safely perform a knob adjustment operation to facilitate removal of the FRU from the network system chassis, and must also take deliberate action to move the guard component to an open position to allow the user to perform the knob adjustment operation.

In this way, the knob adjustment prevention apparatus may be used for FRUs, or similar modular units, of a network system chassis that are not compatible with a hot pluggability feature, to inhibit a user from removing the FRU from the network system chassis without first causing the FRU to enter an inactive state (e.g., an off state). This reduces a likelihood that the FRU is removed from the network system chassis while operating, which thereby reduces a likelihood that the network system enters a standby mode. The network system therefore is able to continue facilitating communications among computing devices within the network, which reduces a likelihood of communication failure, packet data loss, and/or traffic blackholing, among other examples.

FIGS. 1A-1G are diagrams of an example 100 associated with preventing physical adjustment of a knob of an FRU.

Figure 1C:
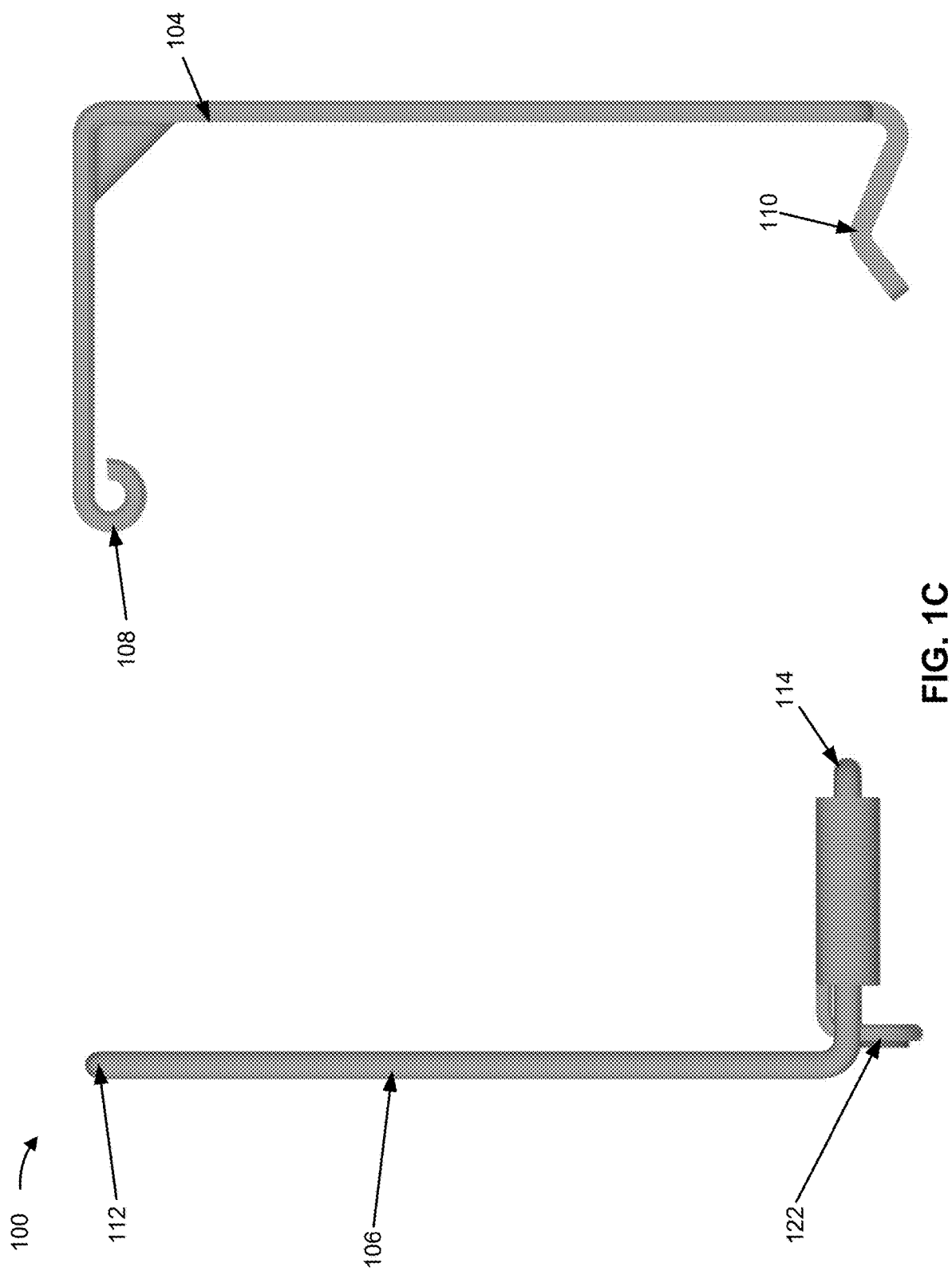
Figure 1D:
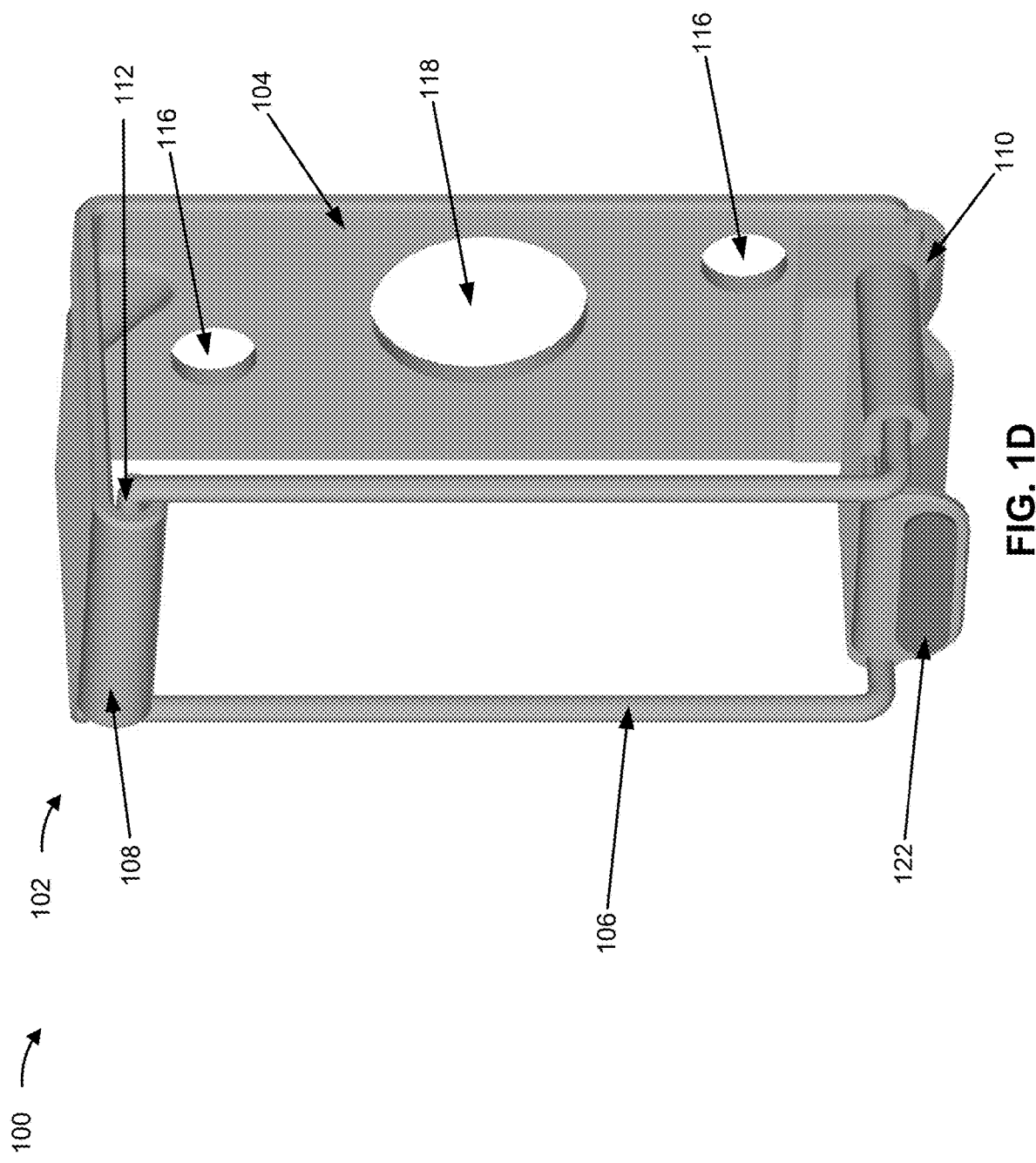
Figure 1E:
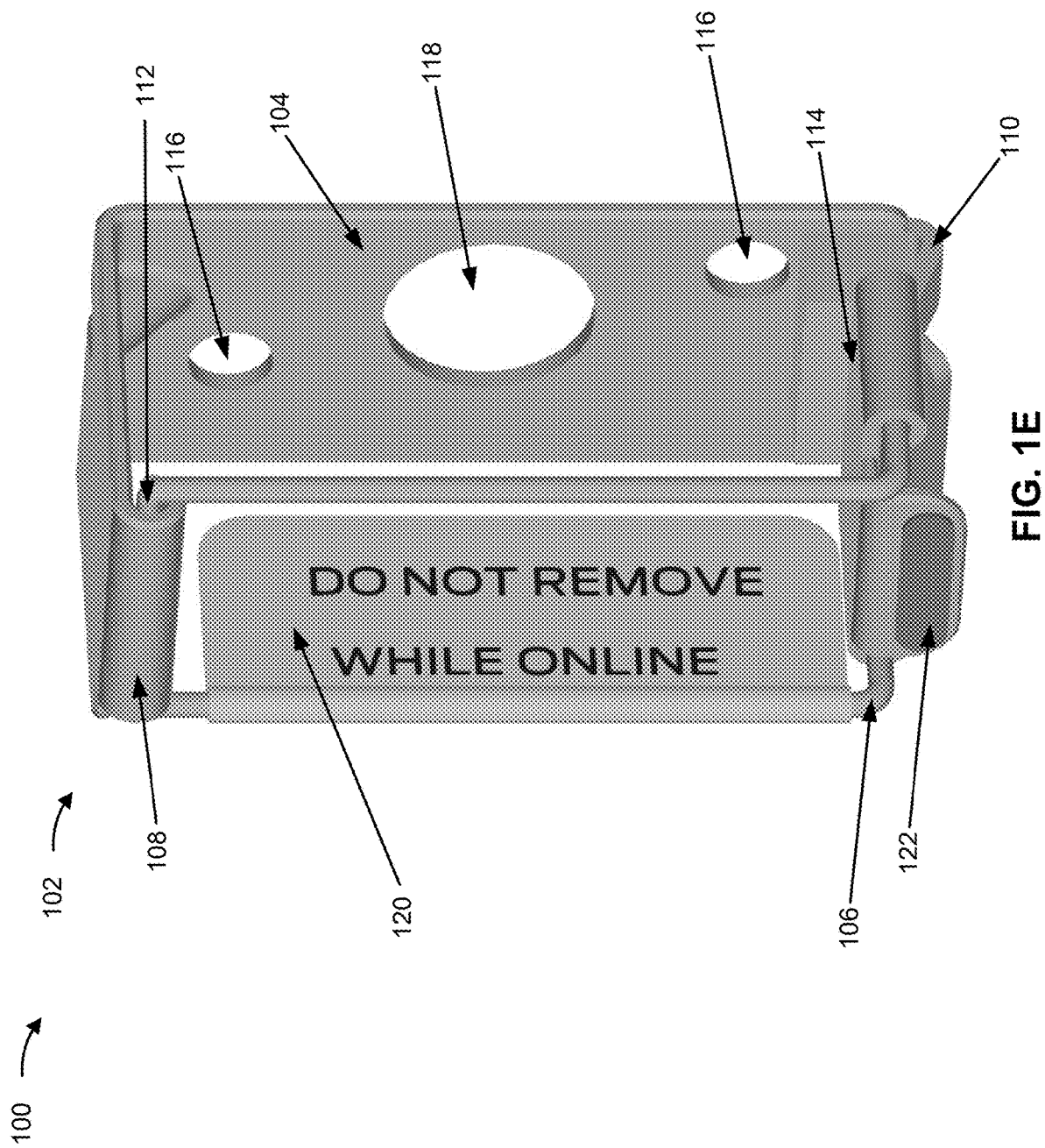
Figure 1F:
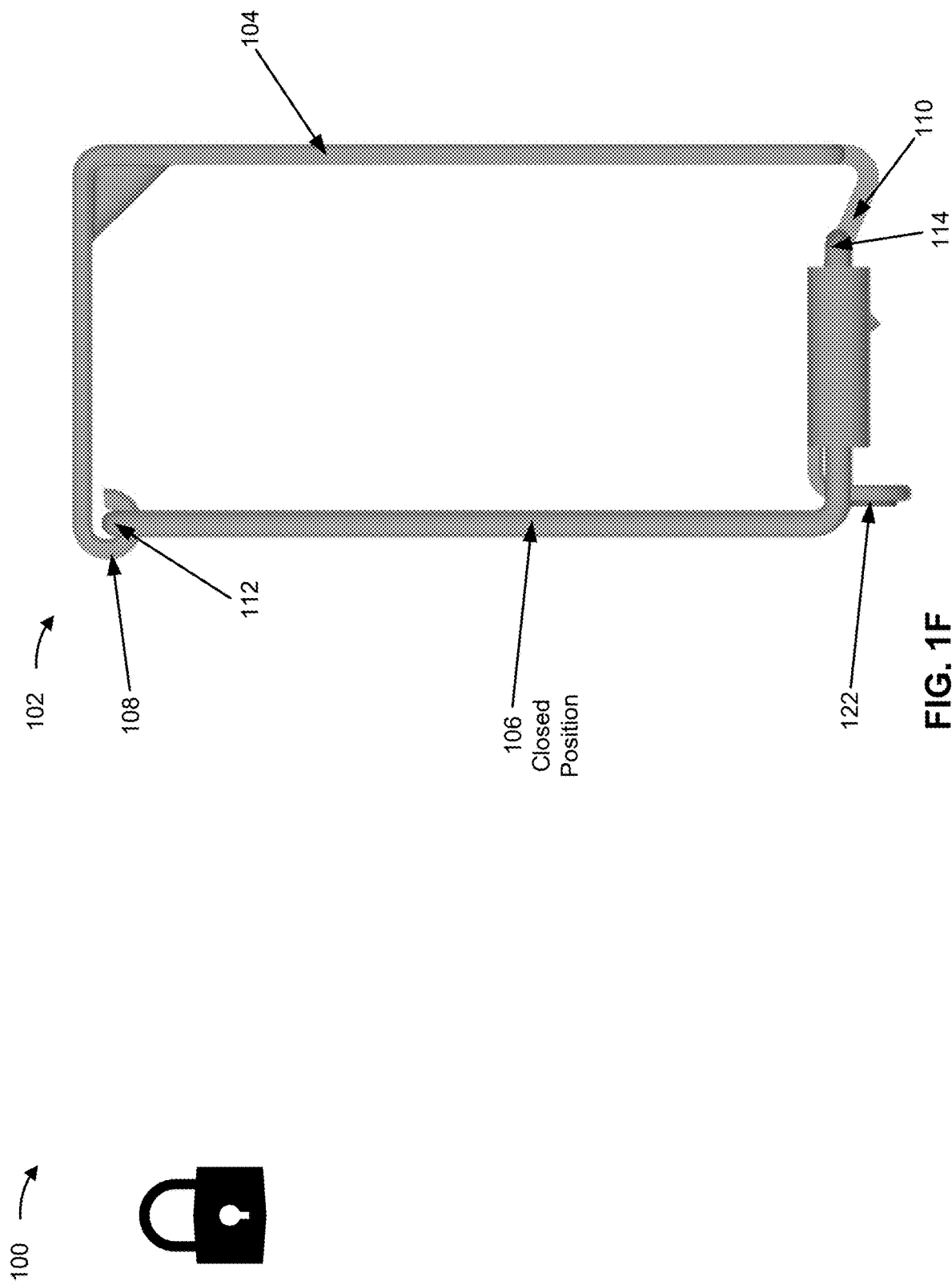
Figure 1G:
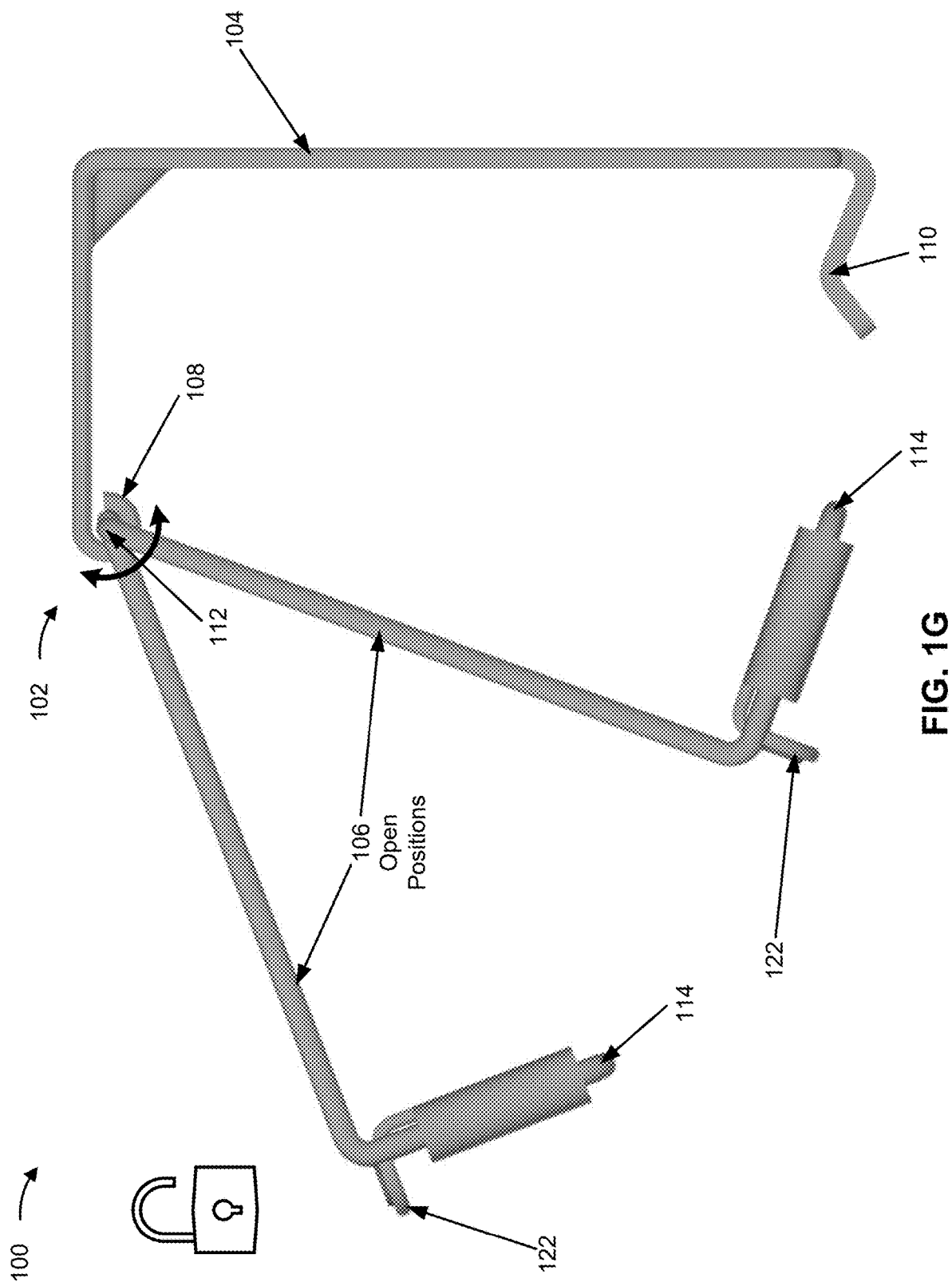

As shown in FIGS. 1A-1G, example 100 includes an apparatus 102 (also referred to as a knob adjustment prevention apparatus 102), which may include a mounting component 104 and a guard component 106. The mounting component 104 may include a hinge element 108 and a latch element 110, and the guard component 106 may include a pivot element 112 and an engagement element 114. FIGS. 1A-1B show side views of example configurations of the apparatus 102; FIG. 1C shows an exploded side view of an example configuration of the apparatus 102; FIGS. 1D-1E show angled side views of example configurations of the apparatus 102; FIG. 1F shows a side view of an example configuration of the apparatus 102 when the guard component 106 is positioned in a closed position; and FIG. 1G shows a side view of an example configuration of the apparatus 102 when the guard component 106 is positioned in multiple open positions.

The mounting component 104 may attach to an FRU (e.g., the FRU 202 described herein in relation to FIGS. 2A-2D). For example, the mounting component 104 may attach to a frame (e.g., the frame 204 described herein in relation to FIGS. 2A-2D) of the FRU. In some implementations, as shown in FIGS. 1D-1E, the mounting component 104 may include one or more holes 116, through which respective fasteners (e.g., screws, bolts, and/or nuts, among other examples) may be inserted to attach the mounting component 104 to the frame of the FRU. Additionally, or alternatively, the mounting component 104 may include a hole 118 through which an ejector component (e.g., the ejector component 208 described herein in relation to FIGS. 2A-2D) of the FRU may be inserted. A knob (e.g., the knob 206 described herein in relation to FIGS. 2A-2D) of the FRU may be attached to an end of the ejector component (e.g., as described herein in relation to FIGS. 2A-2D), and therefore the mounting component 104 may be positioned on a region of the frame of the FRU that is associated with the knob. The knob, when physically adjusted (e.g., manually rotated by a person), may activate the ejector component, which may facilitate removal of the FRU from a network system chassis (e.g., as described herein in relation to FIGS. 2A-2D).

As shown in FIGS. 1A-1G, the mounting component 104 may be a plate (e.g., a metal plate), and may have a "C-shaped" side profile. The hinge element 108 may comprise a first portion (e.g., an upper portion) of the mounting component 104, and the latch element 110 may comprise a second portion (e.g., a lower portion) of the mounting component 104. The hinge element 108 may hold (e.g., pivotally hold) the pivot element 112 of the guard component 106. That is, the hinge element 108 may hold the pivot element 112 such that the pivot element 112 may move (e.g., rotate or pivot) about the hinge element 108 (e.g., when the guard component 106 moves to or from one or more positions, as further described herein). The latch element 110 may contact the engagement element 114 of the guard component 106 when the guard component 106 is positioned in a closed position (e.g., as further described herein). In some implementations, the latch element 110 may inhibit movement of the engagement element 114 of the guard component 106 from the closed position (e.g., unless a physical force associated with a knob adjustment operation is applied to the guard component 106, as further described herein).

Accordingly, the pivot element 112 of the guard component 106 may be connected (e.g., pivotally connected) to the hinge element 108 of the mounting component 104, and the engagement element 114 of the guard component 106 may contact the latch element 110 of the mounting component 104 when the guard component 106 is positioned in the closed position. Additionally, the engagement element 114 of the guard component 106 may not contact the latch element 110 when the guard component 106 is positioned in one or more open positions (e.g., as further described herein).

As further shown in FIGS. 1A-1G, the guard component 106 may have a wire form (e.g., comprising a metal). For example, the pivot element 112 may comprise a first portion (e.g., an upper portion) of the wire form of the guard component 106 and the engagement element 114 may comprise a second portion (e.g., a lower portion) of the wire form of the guard component 106. Accordingly, the first portion of the wire form (e.g., that includes the pivot element 112) may be connected (e.g., pivotally connected) to the hinge element 108 of the mounting component 104, and the second portion of the wire form (e.g., that includes the engagement element 114) may contact the latch element 110 of the mounting component 104 when the guard component 106 is positioned in the closed position (e.g., as further described herein). In this way, such as when the guard component 106 has the wire form, the guard component 106 and/or the apparatus 102 may have a minimal impact on an airflow associated with the FRU (e.g., an airflow that facilitates cooling of the FRU).

The guard component 106, when positioned in the closed position, may surround the knob of the FRU. This may prevent physical adjustment of the knob. For example, the guard component 106 may have an opening through which, when the guard component 106 is positioned in the closed position, the knob is positioned. The opening may be sized such that the knob is unable to be physically adjusted (e.g., rotated) while the guard component 106 is in the closed position (e.g., because one or more sides of the opening of the guard component 106 surround and therefore inhibit movement of the knob within the opening of the guard component 106). By preventing physical adjustment of the knob, the guard component 106 (e.g., when positioned in the closed position) may prevent activation of the ejector component of the FRU, and may thereby prevent removal of the FRU from the network system chassis.

As shown in FIGS. 1B and 1E, the apparatus 102 may include an indicator component 120. The indicator component 120 may be attached to the mounting component 104 or the guard component 106. For example, as shown in FIGS. 1B and 1E, the indicator component may be connected to a portion of the guard component 106 (e.g., a side portion of the guard component 106 when the guard component 106 has a wire form). The indicator component 120 may display information related to the knob, the ejector component, and/or the FRU. For example, the indicator component may display information related to when the FRU can or cannot be removed (e.g., from a network system chassis) via physical adjustment of the knob, such as in relation to operation of the FRU (e.g., the information may indicate that the FRU can be removed when the FRU is not operating). The displayed information may include text (e.g., "DO NOT REMOVE WHILE ONLINE," as shown in FIGS. 1B and 1E), an image, an icon, a symbol, and/or any other type of displayable information.

As shown in FIGS. 1A-1G, the guard component 106 may include a handle element 122. The handle element 122 may be a portion of the guard component 106 that a user (e.g., a network system administrator) may interact with to cause the guard component 106 to move to or from one or more positions. For example, when the guard component 106 is in the closed position, the user may exert a physical force (e.g., a lateral, pushing or pulling, force) on the handle element 122 to cause the guard component 106 to move (e.g., by pivotally moving about the hinge element 108 of the mounting component 104 via the pivot element 112 of the guard component 106) from the closed position to one or more open positions. The user may exert the physical force on the handle element 122 in association with a knob adjustment operation. For example, the user may pull on the handle element 122 to cause the guard component 106 to move to an open position such that the user is able to interact with and adjust the knob (e.g., to facilitate removal of the FRU from a network system). The user would otherwise not be able to interact with and adjust the knob (e.g., because the guard component 106 would otherwise remain in the closed position, as further described herein, which prevents physical adjustment of the knob). In this way, the guard component 106 may move (e.g., pivotally move) from the closed position to one or more open positions when the handle element 122 receives a physical force associated with a knob adjustment operation.

FIG. 1F shows the guard component 106 positioned in a closed position (also referred to as a "locked" position, as indicated by the lock symbol in FIG. 1F). As shown in FIG. 1F, when the guard component 106 is positioned in the closed position, the hinge element 108 may hold (e.g., pivotally hold) the pivot element 112 of the guard component 106, and the engagement element 114 of the guard component 106 may contact the latch element 110 (e.g., such that the latch element 110 inhibits movement of the engagement element 114 of the guard component 106 from the closed position). The closed position of the guard component 106 may be a default position of the guard component 106. For example, gravity may exert a physical force (e.g., a downward, "pushing" force) on the guard component 106 that causes the guard component 106 (e.g., when positioned in one or more open positions) to move to the closed position (and to remain in the closed position). In this way, the guard component 106 may be self-actuated, such that the guard component 106 automatically returns to, or remains in, the closed position (e.g., unless a physical force associated with a knob adjustment operation is applied to the guard component 106, as described herein). Accordingly, the guard component 106 may move (e.g., pivotally move, about the hinge element 108 of the mounting component 104) from one or more open positions to the closed position, such as when the guard component 106 (e.g., via the handle element 122) ceases receiving a physical force associated with a knob adjustment operation.

FIG. 1G shows the guard component 106 positioned in two different open positions (also referred to as "unlocked" positions, as indicated by the unlock symbol in FIG. 1G). As shown in FIG. 1G, when the guard component 106 is positioned in an open position, the hinge element 108 may hold (e.g., pivotally hold) the pivot element 112 of the guard component 106, and the engagement element 114 of the guard component 106 may not be in contact with the latch element 110. The guard component 106 may be positioned in an open position when the guard component 106 (e.g., via the handle element 122) receives a physical force associated with a knob adjustment operation, such as a physical force to oppose the physical force exerted by gravity. Accordingly, the guard component 106 may move (e.g., pivotally move, about the hinge element 108) from the closed position to one or more open positions when the handle element receives a physical force associated with a knob adjustment operation. This allows the guard component 106 to cease being surrounded by the guard component 106 (and therefore the guard component 106 can no longer inhibit movement of the knob), which allows the knob to be physical adjusted (e.g., to facilitate removal of the FRU from a network system chassis). Additionally, or alternatively, the guard component 106 may move (e.g., pivotally move, about the hinge element 108 of the mounting component 104) from the one or more open positions to the closed position, such as when the guard component 106 (e.g., via the handle element 122) ceases receiving the physical force associated with the knob adjustment operation, as described herein.

As indicated above, FIGS. 1A-1G are provided as an example. Other examples may differ from what is described with regard to FIGS. 1A-1G.

Figure 2A:
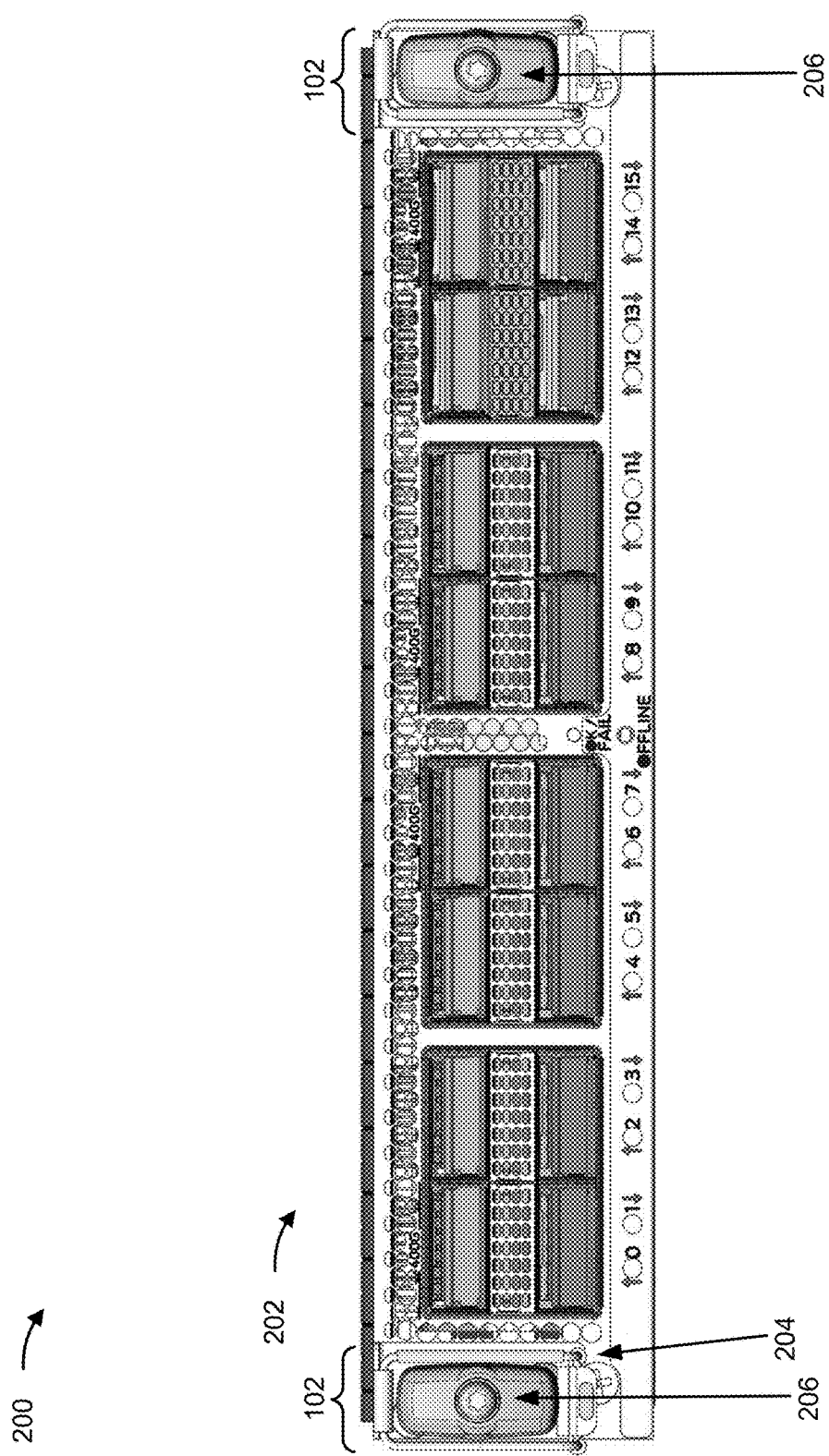
FIGS. 2A-2D are diagrams of an example associated with an FRU described herein.
Figure 2B:
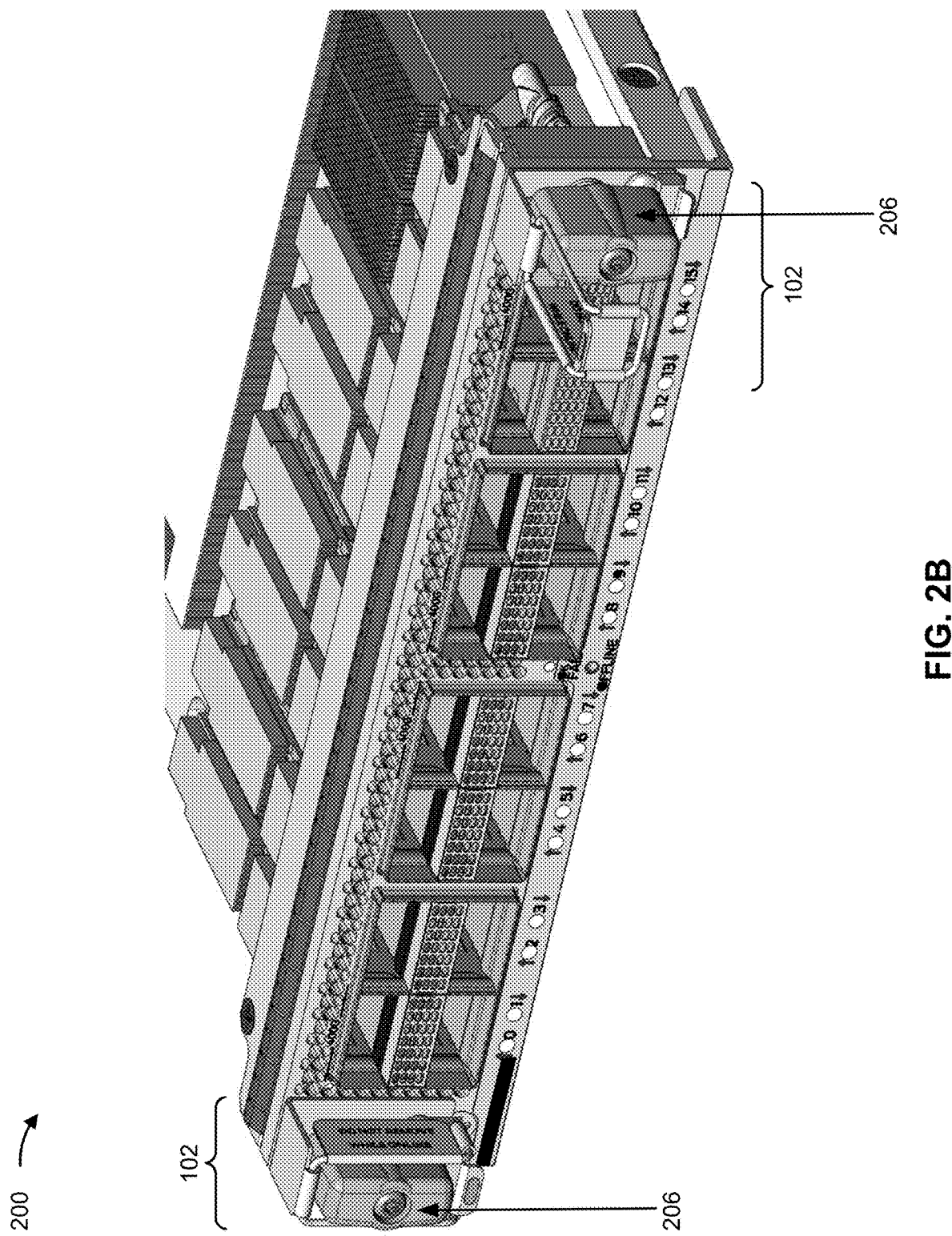
Figure 2C:
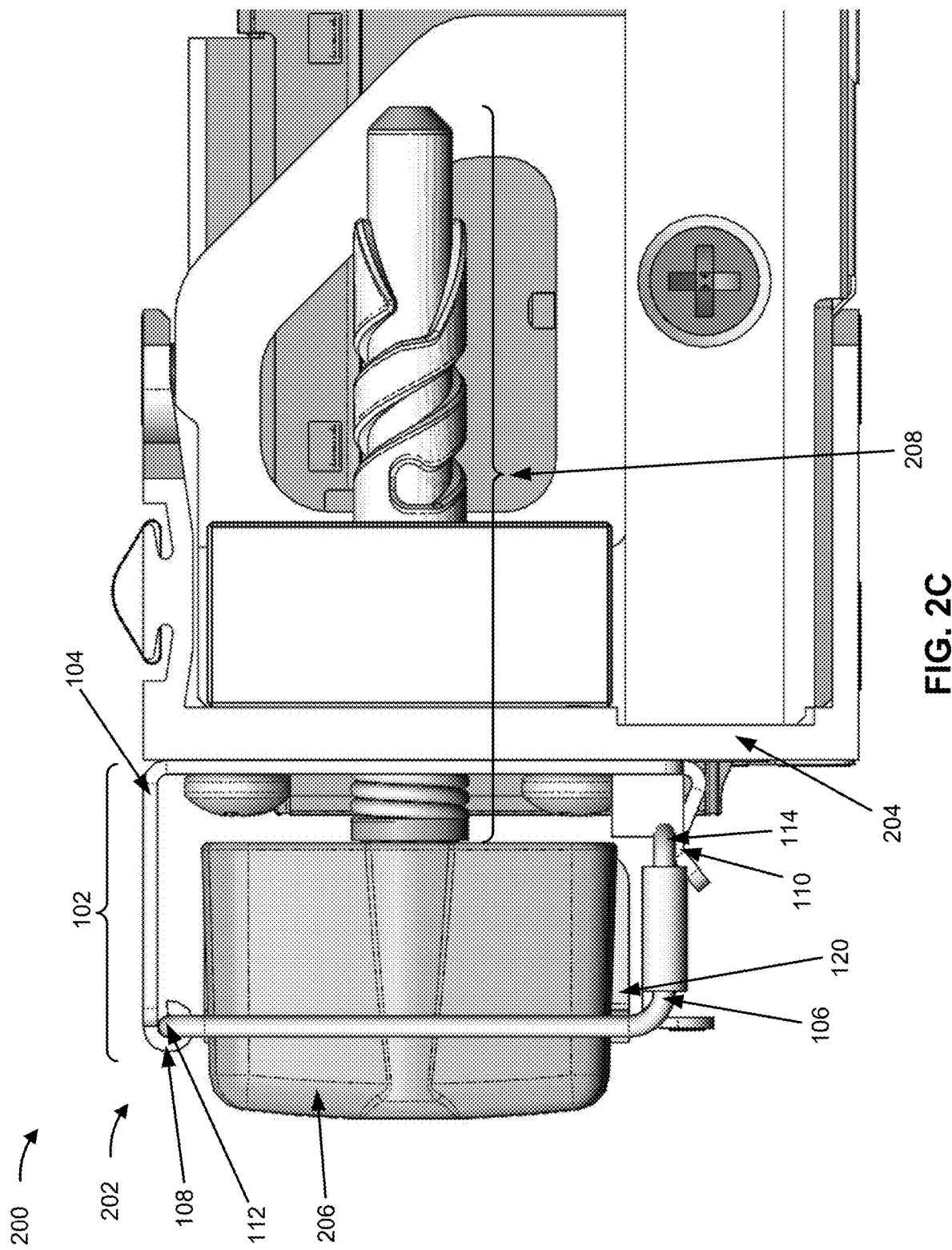
Figure 2D:
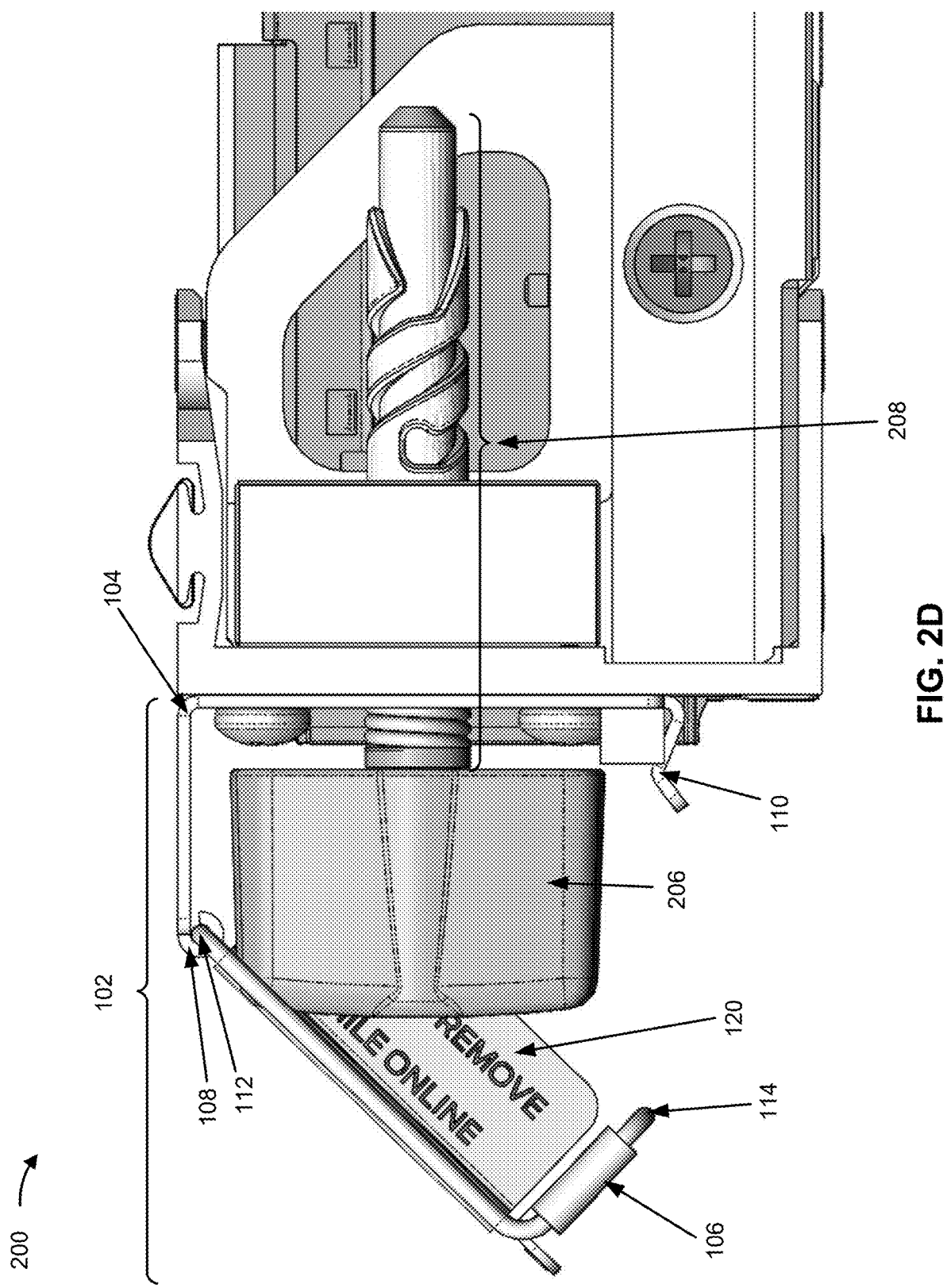

FIGS. 2A-2D are diagrams of an example 200 associated with an FRU described herein. As shown in FIGS. 2A-2D, example 200 includes an FRU 202, which may include a frame 204, a plurality of knobs 206, a plurality of ejector components 208, and a plurality of apparatuses 102. FIG. 2A shows a front view of an example configuration of the FRU 202; FIG. 2B shows an angled front view of an example configuration of the FRU 202; FIG. 2C shows a cross-section side view of an example configuration of the FRU 202, where an apparatus 102 includes a guard component 106 in a closed position; and FIG. 2D shows a cross-section side view of an example configuration of the FRU 202, where an apparatus 102 includes a guard component 106 in an open position.

The FRU 202 may include, for example, one or more components, such as one or more power supplies, uplink modules, transceivers, fan trays, packet forwarding engines, routing engines, and/or switching modules. In some implementations, the FRU 202 may include a modular interface card (MIC), such as a line-card modular interface card (LMIC). The frame 204 of the FRU 202 may provide physical support and/or a housing for the one or more components. The FRU 202 may be configured to be installed into a network system chassis (not shown). Accordingly, one or more connectors of the FRU 202 may attach to one or more corresponding connectors of the network system chassis to allow the FRU 202 to be inserted into and installed in the network system chassis.

When the FRU 202 is inserted into and installed in the network system chassis, the plurality of ejector components 208 may be inserted into corresponding holes of the frame 204 of the FRU 202 (e.g., via corresponding holes 118 of the plurality of apparatuses 102). The plurality of ejector components 208 may include screws, bolts, and/or other components, wherein each ejector component 208 is to facilitate removal of the FRU 202 from the network system chassis. For example, when the ejector components 208 are physically adjusted (e.g., rotated), such as by a user (e.g., a network system administrator), the ejector components 208 may interact with corresponding components of the network system chassis to cause the FRU 202 to eject from the network system chassis. In some implementations, the plurality of knobs 206 may be respectively connected to the plurality of ejector components 208 (e.g., each knob 206 may be connected to an end of a corresponding ejector component 208). Accordingly, the user may physically adjust (e.g., manually rotate) the plurality of knobs 206 to activate the plurality of ejector components 208 (e.g., to physically adjust the plurality of ejector components 208) to facilitate removal of the FRU 202 from the network system chassis.

As shown in FIGS. 2A-2B, the FRU 202 may include a pair of knobs 206 (that are each connected to an ejector component 208). Accordingly, as further shown in FIGS.

2A-2B, the FRU 202 may include a pair of apparatuses 102, where each apparatus 102 prevents adjustment of a corresponding knob 206 (e.g., when a guard component 106 of the apparatus 102 is in a closed position, as described herein in relation to FIGS. 1A-1G). FIG. 2A shows the pair of apparatuses 102 when respective guard components 106 of the pair of apparatuses 102 are in the closed position. FIG. 2B shows a first apparatus 102 (e.g., the left apparatus 102) with its guard component 106 in the closed position, and a second apparatus 102 (e.g., the right apparatus 102) with its guard component 106 in an open position. Accordingly, positioned as shown in FIG. 2B, the first apparatus 102 is to prevent adjustment of a first knob 206 (e.g., the left knob 206), and the second apparatus 102 is to allow adjustment of a second knob 206 (e.g., the right knob 206), such as in a similar manner as that described herein in relation to FIGS. 1A-1G. In some implementations, the second apparatus 102 may have its guard component 106 in another open position (e.g., a "fully open" position where the guard component 106 is resting on top of an upper portion of the mounting component 104), such that a user has unimpeded, or minimally impeded, access to the second knob 206, which allows for the user to more easily adjust the second knob 206.

FIG. 2C shows a cross-section side view of the FRU 202 when an apparatus 102 of the FRU 202 includes a guard component 106 in the closed position. As further shown in FIG. 2C, the guard component 106 may surround a corresponding knob 206, which prevents physical adjustment of the knob 206. By preventing physical adjustment of the knob 206, the guard component 106 may prevent activation of an ejector component 208 that is connected to the knob 206, and may thereby prevent removal of the FRU 202 from the network system chassis.

FIG. 2D shows a cross-section side view of the FRU 202 when an apparatus 102 of the FRU 202 includes a guard component 106 in an open position. As further shown in FIG. 2D, the guard component 106 may cease to surround a corresponding knob 206, which allows physical adjustment of the knob 206 (e.g., by a user, such as a network system administrator). By allowing physical adjustment of the knob 206, the guard component 106 may allow activation of an ejector component 208 that is connected to the knob 206, and may thereby facilitate removal of the FRU 202 from the network system chassis.

As indicated above, FIGS. 2A-2D are provided as an example. Other examples may differ from what is described with regard to FIGS. 2A-2D.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A knob adjustment prevention apparatus, comprising:
a mounting component that includes a hinge element and a latch element; and
a guard component that includes a pivot element and an engagement element, wherein:
the mounting component is to attach to a frame of a field-replaceable unit (FRU),
the guard component is to, when positioned in a closed position, surround a knob of the FRU to prevent physical adjustment of the knob,
the hinge element of the mounting component holds the pivot element of the guard component, and
the engagement element of the guard component is to contact the latch element of the mounting component when the guard component is in the closed position.

2. The knob adjustment prevention apparatus of claim 1, further comprising an indicator component, wherein:
the indicator component displays information related to when the FRU can be removed from a network system chassis via physical adjustment of the knob.

3. The knob adjustment prevention apparatus of claim 2, wherein the indicator component is attached to the mounting component or to the guard component.

4. The knob adjustment prevention apparatus of claim 1, wherein the guard component further includes a handle element, and wherein:
the guard component is to pivotally move, about the hinge element, from the closed position to one or more open positions when the handle element receives a physical force associated with a knob adjustment operation.

5. The knob adjustment prevention apparatus of claim 4, wherein the engagement element of the guard component is to not contact the latch element of the mounting component when the guard component is in the one or more open positions.

6. The knob adjustment prevention apparatus of claim 4, wherein:
the guard component is to pivotally move, about the hinge element, from the one or more open positions to the closed position when the handle element ceases receiving the physical force associated with the knob adjustment operation.

7. The knob adjustment prevention apparatus of claim 1, wherein the guard component has a wire form, and wherein the pivot element comprises a first portion of the wire form and the engagement element comprises a second portion of the wire form.

8. A field-replaceable unit (FRU), comprising:
an ejector component that is to facilitate removal of the FRU from a network system chassis;
a knob that is connected to the ejector component; and
a knob adjustment prevention apparatus that includes a mounting component and a guard component, wherein:
the mounting component is attached to a frame of the FRU, and
the guard component, when positioned in a closed position, surrounds the knob.

9. The FRU of claim 8, wherein the guard component, when positioned in the closed position, prevents physical adjustment of the knob, which prevents activation of the ejector component, and thereby prevents removal of the FRU from the network system chassis.

10. The FRU of claim 8, wherein:
the mounting component includes a hinge element and a latch element;
the guard component includes a pivot element and an engagement element;
the hinge element of the mounting component holds the pivot element of the guard component; and
the engagement element of the guard component is to contact the latch element of the mounting component when the guard component is in the closed position.

11. The FRU of claim 10, wherein the engagement element of the guard component is to not contact the latch element of the mounting component when the guard component is in one or more open positions.

12. The FRU of claim 8, wherein the mounting component includes a hole through which the ejector component is inserted.

13. The FRU of claim 8, wherein the knob adjustment prevention apparatus further includes an indicator component that displays information related to when the FRU can be removed from the network system chassis via physical adjustment of the knob.

14. The FRU of claim 8, wherein the guard component includes a handle element, and wherein:
the guard component is to move from the closed position to one or more open positions when the handle element receives a physical force associated with a knob adjustment operation.

15. The FRU of claim 14, wherein:
the guard component is to move from the one or more open positions to the closed position when the handle element ceases receiving the physical force associated with the knob adjustment operation.

16. A field-replaceable unit (FRU), comprising:
a knob; and
a knob adjustment prevention apparatus that includes a mounting component and a guard component, wherein:
the mounting component is attached to a frame of the FRU,
the guard component is connected to the mounting component and is to move between a closed position and one or more open positions, and
the guard component, when positioned in the closed position, surrounds the knob.

17. The FRU of claim 16, wherein the guard component has a wire form, and wherein:
a first portion of the wire form is pivotally connected to a hinge element of the mounting component, and
a second portion of the wire form is to contact a latch element of the mounting component when the guard component is in the closed position.

18. The FRU of claim 16, wherein the knob adjustment prevention apparatus further includes an indicator component that displays information related to when the FRU can be removed from a network system chassis via physical adjustment of the knob.

19. The FRU of claim 16, wherein the guard component is to move from the closed position to the one or more open positions when the guard component receives a physical force associated with a knob adjustment operation.

20. The FRU of claim 16, wherein the guard component is to move from the one or more open positions to the closed position, or to remain in the closed position, when the guard component does not receive a physical force associated with a knob adjustment operation.

\* \* \* \* \*